(12) United States Patent
Sasaki

(10) Patent No.: US 12,538,731 B2
(45) Date of Patent: Jan. 27, 2026

(54) BATCH SUBSTRATE TREATMENT APPARATUS

(71) Applicant: SCREEN Holdings Co., Ltd., Kyoto (JP)

(72) Inventor: Mitsutoshi Sasaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 305 days.

(21) Appl. No.: 18/320,124

(22) Filed: May 18, 2023

(65) Prior Publication Data

US 2024/0030048 A1     Jan. 25, 2024

(30) Foreign Application Priority Data

Jul. 25, 2022   (JP) .................................. 2022-117635

(51) Int. Cl.
*H01L 21/67* (2006.01)
*B08B 3/04* (2006.01)
(Continued)

(52) U.S. Cl.
CPC ........ *H01L 21/67057* (2013.01); *B08B 3/048* (2013.01); *B08B 3/10* (2013.01);
(Continued)

(58) Field of Classification Search
CPC ......... H01L 21/67057; H01L 21/67051; H01L 21/67086; H01L 21/67253; H01L 21/67757; B08B 3/048; B08B 3/10
See application file for complete search history.

(56) References Cited

U.S. PATENT DOCUMENTS

| | | | |
|---|---|---|---|
| 6,245,250 B1* | 6/2001 | Krawzak | H01L 21/67253 216/99 |
| 2013/0167876 A1 | 7/2013 | Takeaki et al. | |

(Continued)

FOREIGN PATENT DOCUMENTS

| | | |
|---|---|---|
| CN | 103187339 A | 7/2013 |
| CN | 109616429 A | 4/2019 |

(Continued)

OTHER PUBLICATIONS

Notice of Reasons For Refusal dated May 28, 2024 in corresponding Japanese Patent Application No. 2022-117635 and a computer generated English translation obtained from the JPO.

(Continued)

*Primary Examiner* — Levon J Shahinian
*Assistant Examiner* — Lauren G Orta
(74) *Attorney, Agent, or Firm* — OSTROLENK FABER LLP

(57) ABSTRACT

Substrates are immersed in a treatment fluid stored in a treatment chamber, and subjected to a surface treatment. A first lid and a second lid cover an upper opening of the treatment chamber. The first lid and the second lid each include sloped surfaces. At least a part of the first lid and the second lid is immersed in the treatment fluid. During the treatment on the substrates, a plurality of bubble supply pipes eject bubbles into the treatment fluid. The sloped surfaces formed on the first lid and the second lid guide the bubbles reaching an interface between the treatment fluid, the first lid, and the second lid diagonally upward. Thus, the bubbles are smoothly released outside the treatment chamber. This can eliminate retention of the bubbles, avoid contacts between the bubbles and the substrates, and suppress a decrease in the treatment uniformity.

2 Claims, 12 Drawing Sheets

(51) Int. Cl.
*B08B 3/10* (2006.01)
*H01L 21/677* (2006.01)

(52) U.S. Cl.
CPC .. *H01L 21/67051* (2013.01); *H01L 21/67086* (2013.01); *H01L 21/67253* (2013.01); *H01L 21/67757* (2013.01)

(56) References Cited

U.S. PATENT DOCUMENTS

2018/0218924 A1  8/2018  Tanaka et al.
2019/0103294 A1* 4/2019  Masutomi ......... H01L 21/67086

FOREIGN PATENT DOCUMENTS

| JP | H11-102888 A | 4/1999 |
| JP | 2013-161916 A | 8/2013 |
| JP | 2018-125516 A | 8/2018 |
| JP | 2019-67995 A | 4/2019 |
| JP | 2021-106254 A | 7/2021 |

OTHER PUBLICATIONS

Chinese First Office Action with Search Report dated Mar. 15, 2025 in corresponding Chinese Patent Application No. 2023-10895728.4 and a computer generated English translation obtained from the JPO.

* cited by examiner

F I G. 12
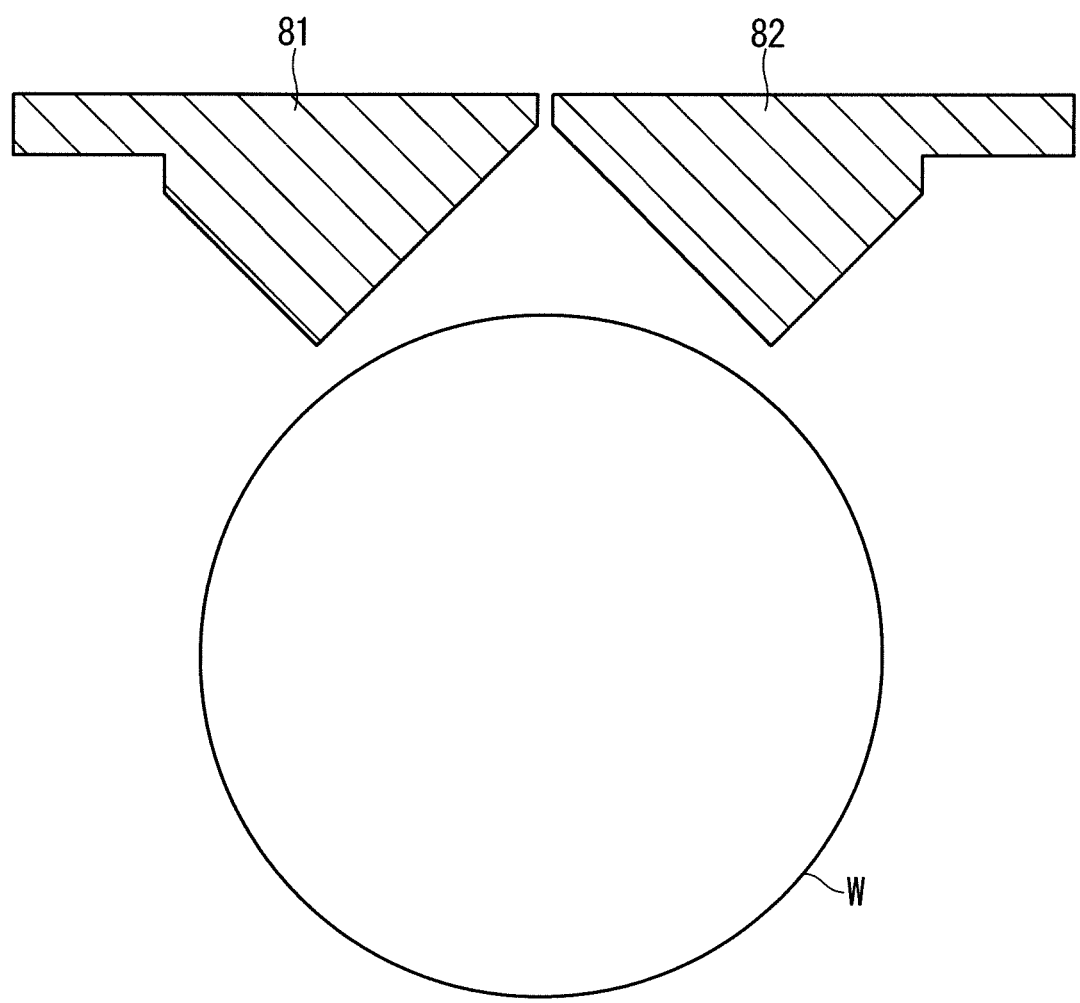

BATCH SUBSTRATE TREATMENT APPARATUS

BACKGROUND OF THE INVENTION

Field of the Invention

The present disclosure relates to a substrate treatment apparatus that subjects substrates to a surface treatment such as etching, using a treatment fluid. Examples of the substrates to be treated include a semiconductor substrate, a substrate for liquid crystal display, a substrate for flat panel display (FPD), a substrate for optical disk, a substrate for magnetic disk, and a substrate for solar cell.

Description of the Background Art

Conventionally, substrate treatment apparatuses that subject substrates such as semiconductor substrates to various treatments have been used in processes of manufacturing semiconductor devices. Batch substrate treatment apparatuses each of which stores a treatment fluid in treatment chambers, immerses a plurality of substrates in the treatment fluid in a batch, and etches and cleans the substrates are known as one type of the substrate treatment apparatuses.

Japanese Patent Application Laid-Open No. 2021-106254 discloses a treatment fluid ejector that ejects, in a treatment chamber, a treatment fluid to a lower portion of the plurality of substrates held by a substrate holder, and bubblers that supply bubbles. Supply of the bubbles in the treatment fluid in addition to ejection of the treatment fluid accelerates the velocity of the treatment fluid in the treatment chamber, and increases the efficiency of the surface treatment on the substrates.

Particularly, supplying bubbles of nitrogen gas into a treatment fluid to replace dissolved oxygen in the treatment fluid with nitrogen and control an etching rate in etching polysilicon using tetramethylammonium hydroxide (TMAH) has been studied. Increasing an etching rate for increasing a throughput requires constantly supplying bubbles of nitrogen gas to reduce a concentration of dissolved oxygen in the treatment fluid to an absolute minimum.

In the etching using TMAH, placing a lid (a cover) on a treatment chamber and immersing a part of the lid into a fluid level of a treatment fluid to reduce dissolving oxygen from an atmosphere into the treatment fluid has also been studied. However, continuing to supply bubbles of nitrogen gas with the part of the lid being immersed into the fluid level of the treatment fluid causes the bubbles of nitrogen gas to gather at an interface between the lid and the treatment fluid and come in contact with upper ends of substrates. This creates problems of failing to etch the contact portions and reducing the in-plane uniformity in the etching.

SUMMARY

The present disclosure is directed to a substrate treatment apparatus that subjects substrates to a surface treatment using a treatment fluid.

According to an aspect of this disclosure, the substrate treatment apparatus includes: a treatment chamber storing the treatment fluid; a treatment fluid supplying part supplying the treatment fluid into the treatment chamber; a substrate holder holding the substrate and immersing the substrate in the treatment fluid stored in the treatment chamber; a tubular bubble supply pipe disposed inside the treatment chamber and supplying, from below the substrate held by the substrate holder, bubbles in the treatment fluid stored in the treatment chamber; and a lid covering an upper opening of the treatment chamber, wherein the lid includes: a first sloped surface leading more upward as getting closer to an edge of the lid; and a second sloped surface leading more upward as getting closer to a center of the lid.

The bubbles supplied from the bubble supply pipe into the treatment fluid are guided diagonally upward along the first sloped surface and the second sloped surface, and smoothly released outside the treatment chamber. Even when the bubbles are supplied with the lid being immersed in the treatment fluid, a decrease in the treatment uniformity can be suppressed.

Preferably, an upper end of the second sloped surface is higher than an upper end of the first sloped surface.

Relatively a wider space is provided above the proximity of the upper end of the substrate. Thus, the bubbles are hardly retained above the upper end of the substrate at the shortest distance from the fluid level. Consequently, contacts between the substrate and the bubbles can be more reliably prevented.

Therefore, the object of this disclosure is to suppress a decrease in the treatment uniformity even when the bubbles are supplied with the lid being immersed in the treatment fluid.

These and other objects, features, aspects, and advantages of the present invention will become more apparent from the following detailed description of the present invention when taken in conjunction with the accompanying drawings.

BRIEF DESCRIPTION OF THE DRAWINGS

FIG. 12 illustrates another example positional relationship between the lid and the substrates.

DESCRIPTION OF THE PREFERRED EMBODIMENTS

Hereinafter, an embodiment of the present disclosure will be described in detail with reference to the drawings. Unless otherwise noted, the expressions indicating relative or absolute positional relationships (e.g., "in one direction", "along one direction", "parallel", "orthogonal", "central", "concentric", and "coaxial") include those exactly indicating the positional relationships and those where an angle or a distance is relatively changed within tolerance or to the extent that similar functions can be obtained. Unless otherwise noted, the expressions indicating equality (e.g., "same", "equal", "uniform", and "homogeneous") include those indicating quantitatively exact equality and those in the presence of a difference within tolerance or to the extent that similar functions can be obtained. Unless otherwise noted, the expressions indicating shapes (e.g., "circular", "rectangular" or "cylindrical") include those indicating geometrically exact shapes and those indicating, for example, roughness or a chamfer to the extent that similar advantages can be obtained. An expression "comprising", "including", "containing", or "having" a certain constituent element is not an exclusive expression for excluding the presence of the other constituent elements. An expression "at least one of A, B, or C" involves "only A", "only B", "only C", "arbitrary two of A, B, and C", and "all of A, B, and C".

Figure 1:
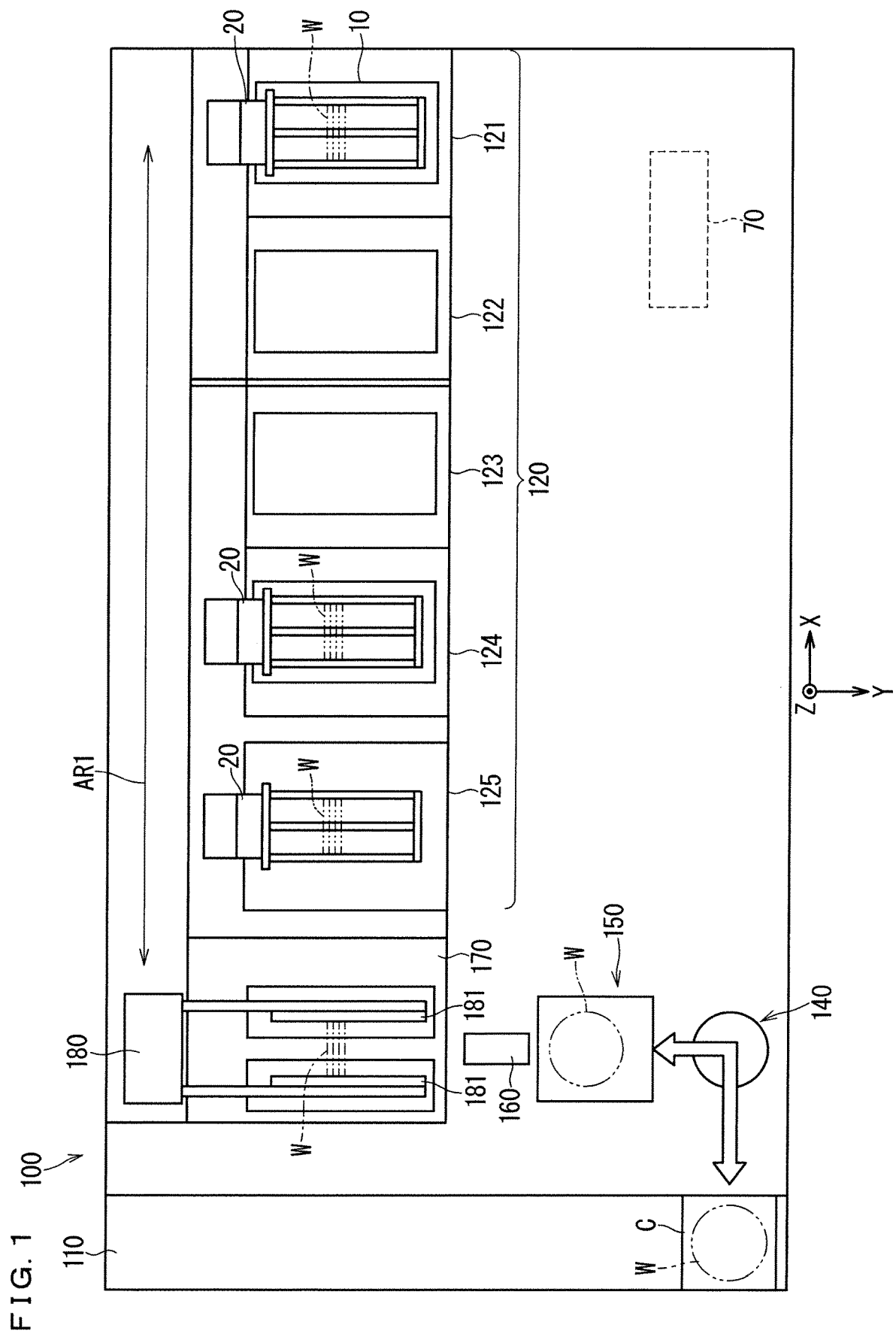
FIG. 1 is a plan view illustrating in diagrammatic form an overall structure of a substrate treatment apparatus according to the present disclosure.

FIG. 1 is a plan view illustrating in diagrammatic form an overall structure of a substrate treatment apparatus 100 according to the present disclosure. The substrate treatment apparatus 100 is a batch substrate treatment apparatus that subjects a plurality of substrates W to a surface treatment in a batch, using a treatment fluid. Examples of the substrates be treated are circular semiconductor substrates made of silicon. It should be noted that dimensions and the number of components in FIG. 1 and the subsequent figures are shown in exaggeration or in simplified form as appropriate for the sake of easier understanding. Furthermore, FIG. 1 and the subsequent figures appropriately illustrate an XYZ rectangular coordinate system for clarifying the direction relationship, using the Z-axis direction as a vertical direction and an XY plane as a horizontal surface.

The substrate treatment apparatus 100 mainly includes a load port 110, a loading/unloading robot 140, a posture transformation mechanism 150, a pusher 160, a main transport robot 180, a substrate treatment part group 120, a transfer cassette 170, and a controller 70.

The load port 110 is disposed at an end of the substrate treatment apparatus 100 that is shaped as an approximate rectangle in a plan view. A carrier C that houses a plurality of substrates (simply referred to as "substrates") W to be treated in the substrate treatment apparatus 100 is placed in the load port 110. The carrier C that houses the substrates W to be treated is transported by, for example, an unmanned transport vehicle (AGV, OHT), and is placed in the load port 110. The carrier C that houses the treated substrates W is also carried away from the load port 110 by the unmanned transport vehicle.

The carrier C is typically a front opening unified pod (FOUP) that houses the substrates W in an airtight space. The carrier C holds the plurality of substrates W stacked in a vertical direction (Z direction) at regular intervals in a plurality of holding shelves disposed inside the carrier C, in a horizontal attitude (an attitude such that the normal coincides with the vertical direction). The maximum number of the substrates W that can be housed in the carrier C is 25 or 50. Besides the FOUP, the carrier C may be a Standard Mechanical Interface (SMIF) pod or an open cassette (OC) that exposes the housed substrates W to outside air.

A pod opener (not illustrated) is disposed at a boundary between the body of the substrate treatment apparatus 100 and the load port 110. The pod opener opens and closes a lid on the front surface of the carrier C placed in the load port 110.

The loading/unloading robot 140 transports the substrates W to be treated from the carrier C into the body of the substrate treatment apparatus 100, and also transports the treated substrates W from the body of the substrate treatment apparatus 100 into the carrier C, while the lid of the carrier C placed in the load port 110 is opened. Specifically, the loading/unloading robot 140 transports the plurality of substrates W between the carrier C and the posture transformation mechanism 150. The loading/unloading robot 140 is pivotable on the horizontal surface, and includes a movable batch hand (not illustrated) including a plurality of hand elements which are stacked in multiple layers and each of which can hold one of the substrates W.

The posture transformation mechanism 150 rotates the plurality of substrates W received from the loading/unloading robot 140 around the X axis at a 90° angle, and transforms the attitude of the substrates W from the horizontal attitude to a standing attitude (an attitude such that the normal coincides with the horizontal direction). Furthermore, the posture transformation mechanism 150 transforms the attitude of the substrates W from the standing attitude to the horizontal attitude before passing the substrates W to the loading/unloading robot 140.

The pusher 160 is disposed between the posture transformation mechanism 150 and the transfer cassette 170. The pusher 160 passes the substrates W in the standing posture, between the posture transformation mechanism 150 and a lifting/lowering stage (not illustrated) disposed in the transfer cassette 170.

The transfer cassette 170 and the substrate treatment part group 120 are aligned in a row in the X direction. The substrate treatment part group 120 includes five treatment parts 121, 122, 123, 124, and 125. The treatment parts 121 to 125 are main parts of the substrate treatment apparatus 100 that subjects the substrates W to various surface treatments. As illustrated in FIG. 1, the treatment parts 121, 122, 123, 124, and 125 are disposed in this order from the +X side in the substrate treatment apparatus 100. Each of the treatment parts 121, 122, 123, and 124 includes a treatment chamber 10 that stores a treatment fluid.

The treatment parts 121 and 123 store respective chemical solutions of the same kind or different kinds, and immerse the plurality of substrates W in the chemical solutions in a batch to subject the substrates W to a chemical solution treatment such as etching. Furthermore, the treatment parts 122 and 124 store respective rinse solutions (typically, de-ionized water), and immerse the plurality of substrates W in the rinse solutions in a batch to subject the substrates W to a rinse treatment.

In the substrate treatment part group 120, the treatment parts 121 and 122 are paired, and the treatment parts 123 and 124 are paired. Furthermore, one lifter 20 that is a dedicated transport mechanism is provided for the pair of the treatment parts 121 and 122. The lifter 20 is movable along the X direction between the treatment parts 121 and 122. Furthermore, the lifter 20 can move upward and downward in each of the treatment parts 121 and 122. Similarly, another lifter 20 that is a dedicated transport mechanism is provided for the pair of the treatment parts 123 and 124.

The lifter 20 holds the plurality of substrates W received from the main transport robot 180, and immerses the plurality of substrates W in the chemical solution stored in the treatment chamber 10 of the treatment part 121. After the chemical solution treatment, the lifter 20 lifts the substrates W from the treatment part 121, transfers the substrates W to the treatment part 122, and immerses the substrates W in the rinse solution stored in the treatment chamber 10 of the treatment part 122. After the rinse treatment, the lifter 20 lifts the substrates W from the treatment part 122, and passes the substrates W to the main transport robot 180. In the treatment parts 123 and 124, the lifter 20 performs the same operations.

The treatment part 125 includes a mechanism for reducing a pressure of an airtight drying chamber to less than an atmospheric pressure, a mechanism for supplying an organic solvent (e.g., isopropyl alcohol (IPA)) to the drying chamber, and another lifter 20. The treatment part 125 houses, into the drying chamber, the substrates W received from the main transport robot 180 through the lifter 20, reduces the pressure in the drying chamber to a reduced atmospheric pressure, and dries the substrates W by supplying the organic solvent to the substrates W. The treatment part 125 passes the dried substrates W to the main transport robot 180 through the lifter 20.

The transfer cassette 170 is disposed below the main transport robot 180 at a wait position (a position of the main transport robot 180 in FIG. 1). The transfer cassette 170 includes the lifting/lowering stage that is not illustrated. The lifting/lowering stage raises the substrates W received from the pusher 160 while maintaining the substrates W in the standing posture as they are, and passes the substrates W to the main transport robot 180. Furthermore, the lifting/lowering stage lowers the substrates W received from the main transport robot 180, and passes the substrates W to the pusher 160.

The main transport robot 180 is configured to perform a sliding movement in the X direction as indicated by an arrow AR1 in FIG. 1. The main transport robot 180 transports the substrates W between the wait position above the transfer cassette 170 and a treatment position above one of the treatment parts 121, 122, 123, 124, and 125.

The main transport robot 180 includes a pair of substrate chucks 181 that holds the plurality of substrates W in a batch. The main transport robot 180 can hold the plurality of substrates W in a batch by narrowing a distance between the pair of substrate chucks 181, and release the holding state by increasing the distance between the substrate chucks 181. The main transport robot 180 with such a structure can pass and receive the substrates W not only to and from the lifting/lowering stage of the transfer cassette 170 but also to and from each of the lifters 20 disposed in the substrate treatment part group 120.

Figure 2:
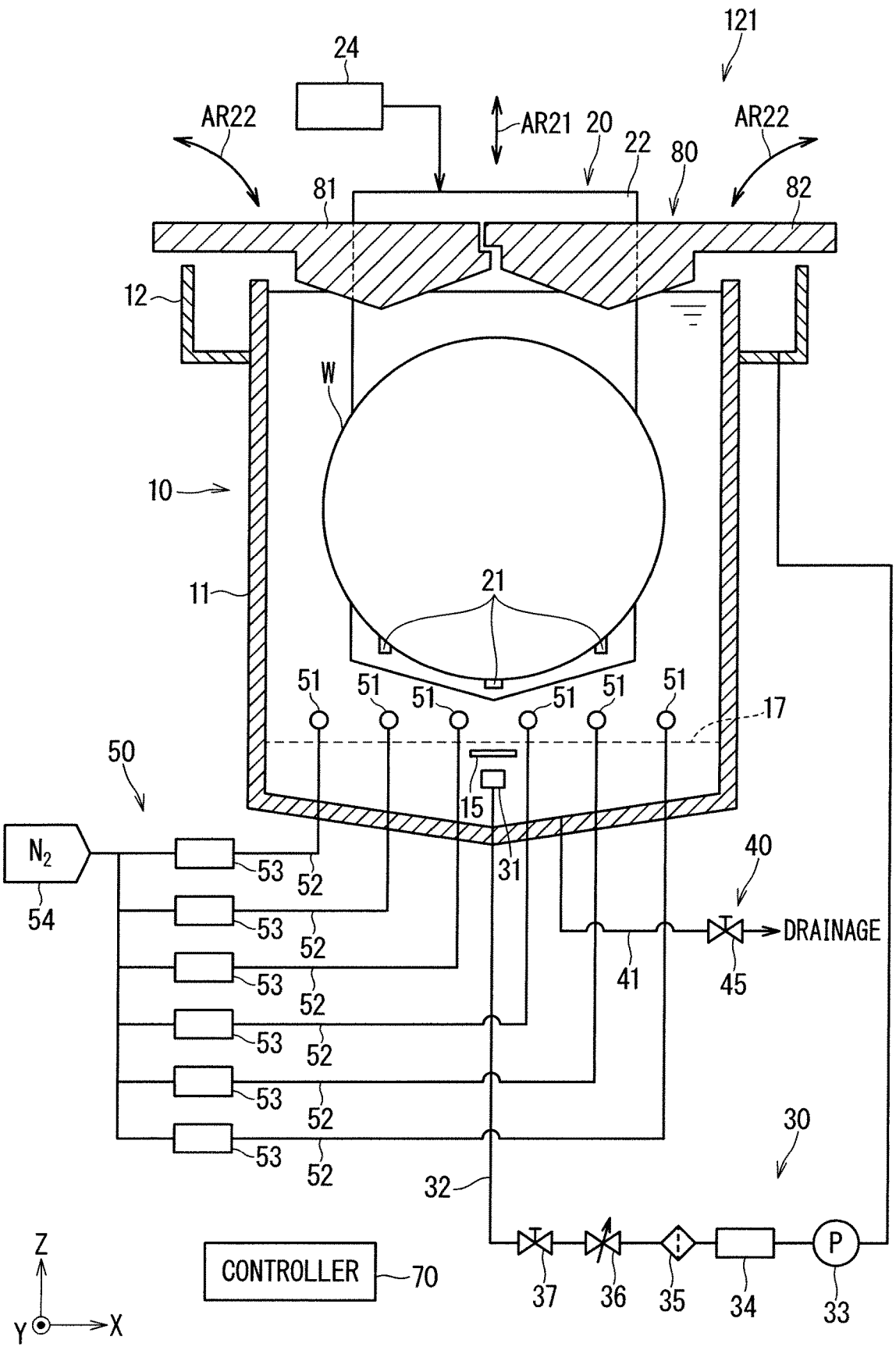
FIG. 2 illustrates a structure of a treatment part in the substrate treatment apparatus in FIG. 1.

Next, a structure of the treatment part 121 disposed in the substrate treatment apparatus 100 will be described. The treatment part 123 has the same structure as that of the treatment part 121 described herein. FIG. 2 illustrates the structure of the treatment part 121. As illustrated in FIG. 2, the treatment part 121 mainly includes: the treatment chamber storing a treatment fluid; the lifter 20 that holds the plurality of substrates W and moves upward and downward; a treatment fluid supplying part 30 that supplies the treatment fluid into the treatment chamber 10; a drainage part 40 that drains the treatment fluid from the treatment chamber 10; a bubble supplying part 50 that supplies bubbles into the treatment fluid stored in the treatment chamber 10; and a lid 80 that opens and closes an upper opening of the treatment chamber 10.

The treatment chamber 10 is a storage container made of a material with tolerance to chemical solutions, such as quartz. The treatment chamber 10 has a double-chamber structure including an inner chamber 11 which stores the treatment fluid and inside of which the substrates W are immersed, and an outer chamber 12 formed around an outer periphery of an upper end of the inner chamber 11. Each of the inner chamber 11 and the outer chamber 12 has an upper opening opened upward. The upper edge of the outer chamber 12 is slightly higher than the upper edge of the inner chamber 11. When the treatment fluid is stored up to the upper end of the inner chamber 11 and the treatment fluid supplying part 30 further supplies the treatment fluid, the treatment fluid spills from the upper portion of the inner chamber 11, and overflows to the outer chamber 12. The treatment chamber 10 according to the embodiment is a chamber with liquid-saving specification designed to reduce the amount of the treatment fluid to be used. Thus, the capacity of the inner chamber 11 is relatively small.

The "treatment fluids" in this Description are conceptual terms meaning various chemical solutions and de-ionized water. Examples of the chemical solutions include an etching solution and a solution for removing particles, and specifically include tetramethylammonium hydroxide (TMAH), an SC-I solution (a mixed solution of ammonium hydroxide, a hydrogen peroxide solution, and de-ionized water), an SC-II solution (a mixed solution of hydrochloric acid, a hydrogen peroxide solution, and de-ionized water), and phosphoric acid. The chemical solutions include chemical solutions dissolved in de-ionized water. In this embodiment, a mixed solution of TMAH, isopropyl alcohol (IPA), and de-ionized water is used as a treatment fluid.

The lifters 20 are transport mechanisms for transporting the substrates W upward and downward while holding the substrates W. Each of the lifters 20 includes a back plate 22 extending in the vertical direction (Z direction), and three retention bars 21 extending from the lower end of the back plate 22 in the horizontal direction (Y direction). The lower end of the back plate 22 is V-shaped. Each of the three retention bars 21 extending from the lower end of the back plate 22 includes a plurality of retention ditches (e.g., 50 retention ditches) formed with predetermined pitches. The plurality of substrates W are held parallel to each other at regular spacings in the standing posture on the three retention bars 21, with peripheral portions of the substrates W being engaged in the retention ditches.

Figure 3:
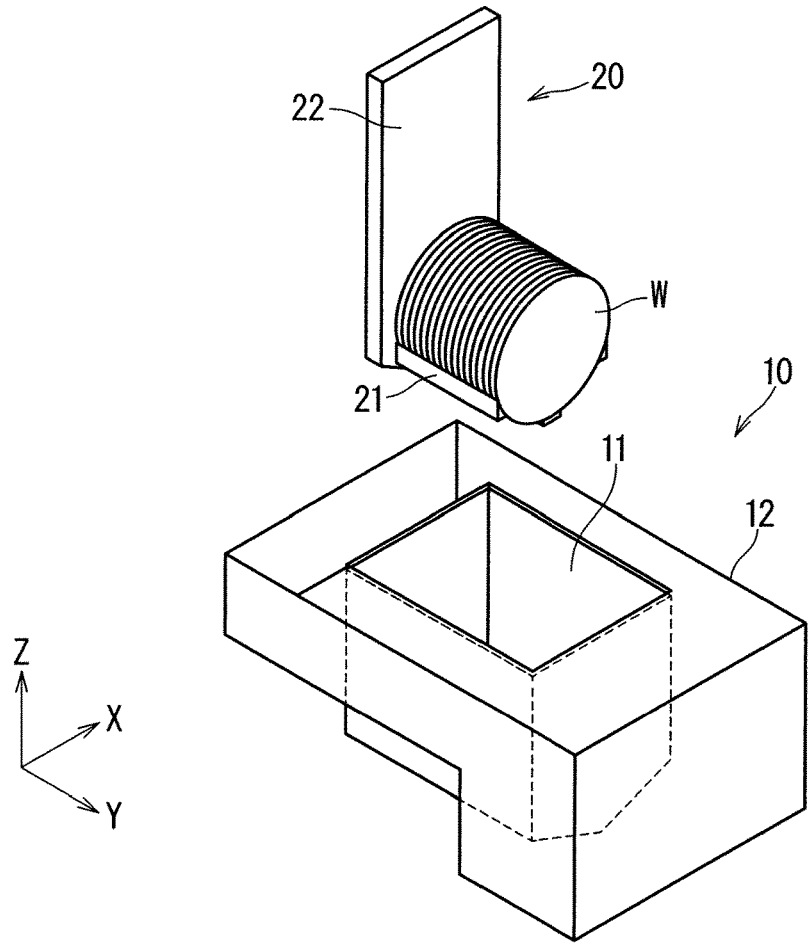
FIG. 3 illustrates a state where a lifter moves upward.
Figure 4:
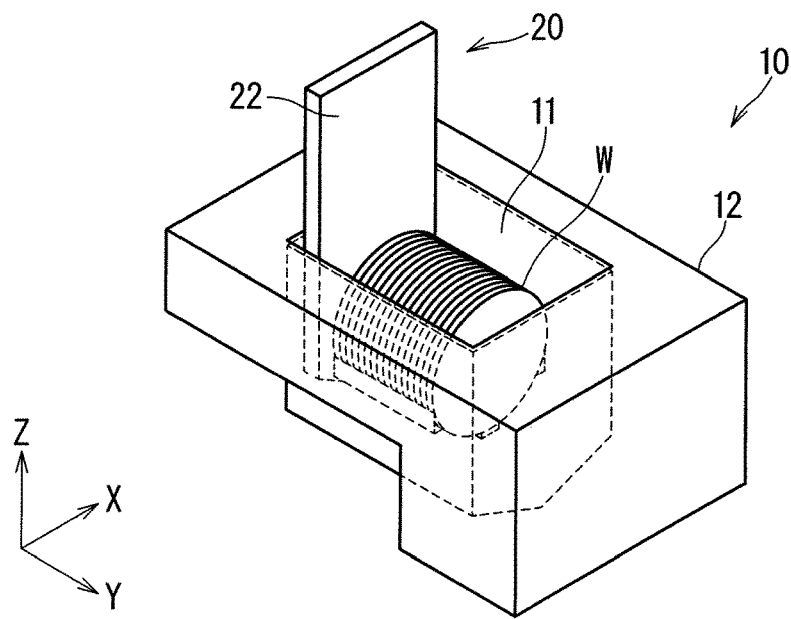
FIG. 4 illustrates a state where the lifter moves downward.

Furthermore, the lifter 20 is connected to a driving mechanism 24 conceptually illustrated in FIG. 2. The driving mechanism 24 causes the lifter 20 to move upward and downward. FIGS. 3 and 4 illustrate upward and downward operations of the lifter 20. When the driving mechanism 24 is operated with the lid 80 being opened, the lifter 20 moves upward and downward. As indicated by an arrow AR21 in FIG. 2, the substrates W held by the lifter 20 are moved upward and downward between an immersion position inside the treatment chamber 10 (a position in FIG. 4) and a lifting position above the treatment chamber 10 (a position in FIG. 3). When the substrates W are lowered to the immersion position with the treatment fluid being stored in the treatment chamber 10, the substrates W are immersed in the treatment fluid and subjected to the surface treatment. In other words, the lifter 20 functions as a substrate holder that holds the substrates W and immerses the substrates W in the treatment fluid stored in the treatment chamber 10 during the treatment.

Referring again to FIG. 2, the treatment fluid supplying part 30 includes a nozzle 31, and a pipe line that feeds the treatment fluid to the nozzle 31. The nozzle 31 is disposed at the bottom of the inner chamber 11 of the treatment chamber 10. A distribution plate 15 is disposed immediately above the nozzle 31 to face the nozzle 31. Furthermore, a punching plate 17 is disposed above the distribution plate 15.

Figure 5:
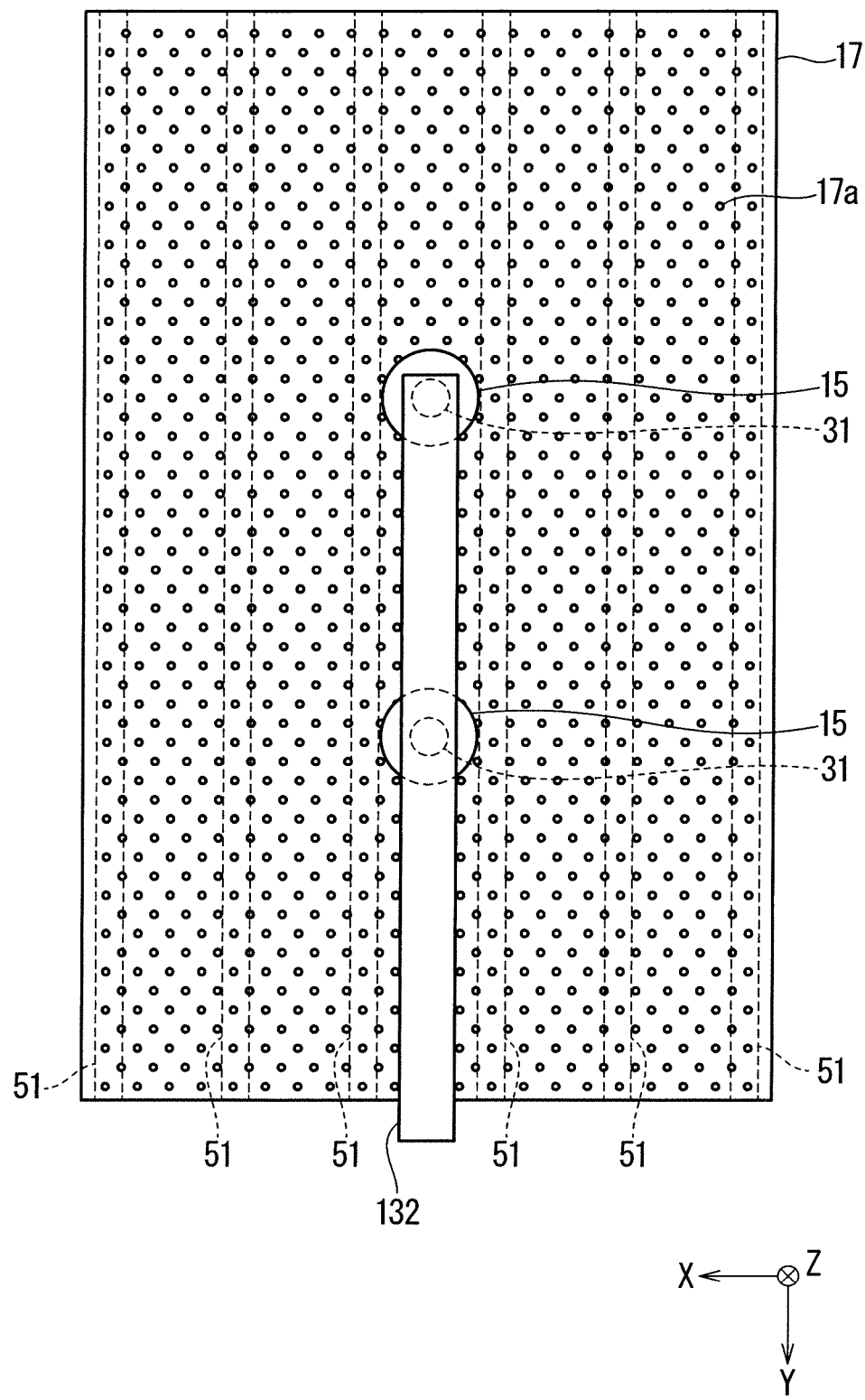
FIG. 5 illustrates nozzles, distribution plates, and a punching plate when viewed from the bottom of treatment chambers.

FIG. 5 illustrates the nozzles 31, the distribution plates 15, and the punching plate 17 when viewed from the bottom of the treatment chambers 10. A pipe 132 includes tips (portions extending into the treatment chambers 10) of pipes 32 of the treatment fluid supplying parts 30. The plurality of nozzles 31 are disposed at upper portions of the pipe 132. Each of the nozzles 31 is connected in communication with the pipe 132. The distribution plate 15 is disposed above each of the nozzles 31. The distribution plates 15 are disk-shaped parts parallel to the horizontal surface. The nozzles 31 protrude vertically upward from the pipe 132 toward the distribution plates 15. The punching plate 17 is disposed across the entire horizontal cross-section of the inner chambers 11 further above the distribution plates 15. A plurality of treatment fluid holes 17a are formed on the entire surface of the punching plate 17.

The treatment fluid fed to the pipe 132 is ejected from the nozzles 31 toward the distribution plates 15 immediately above the nozzles 31. When the treatment fluid is ejected upward from the nozzles 31 with the treatment fluid being stored in the treatment chambers 10, the flow of the treatment fluid hits the distribution plates 15 to distribute the pressure of the treatment fluid. Consequently, the treatment fluid spreads in the horizontal direction along the plane of the distribution plates 15. Then, the treatment fluid spread by the distribution plates 15 in the horizontal direction rises from the plurality of treatment fluid holes 17a of the punching plate 17 to form a laminar flow of the treatment fluid in the treatment chambers 10 from downward to upward. In other words, the punching plate 17 forms the laminar flow of the treatment fluid in the treatment chambers 10.

Referring again to FIG. 2, the pipe line that feeds the treatment fluid to the nozzle 31 includes a pump 33, a heater 34, a filter 35, a flow adjustment valve 36, and a valve 37 all of which are disposed in the pipe 32. The pump 33, the heater 34, the filter 35, the flow adjustment valve 36, and the valve 37 are disposed in this order from upstream to downstream of the pipe 32 (from the outer chamber 12 to the inner chamber 11).

The tips of the pipes 32 extending into the treatment chambers 10 become the pipe 132 (FIG. 5), and the base ends of the pipes 32 are connected to the respective outer chambers 12. Each of the pipes 32 guides the treatment fluid flowing out of the outer chamber 12 again to the inner chamber 11. In other words, the treatment fluid supplying part 30 circulates the treatment fluid in the treatment chamber 10. The pump 33 discharges the treatment fluid from the outer chamber 12 to the pipe 32, and delivers the treatment fluid to the nozzle 31. The heater 34 heats the treatment fluid flowing through the pipe 32. When, for example, phosphoric acid is used as the treatment fluid, the heater 34 heats the treatment fluid, and stores, in the treatment chamber 10, the treatment fluid whose temperature has been increased.

The filter 35 filters the treatment fluid flowing through the pipe 32 to remove, for example, impurities. The flow adjustment valve 36 adjusts a flow rate of the treatment fluid flowing through the pipe 32. The valve 37 opens and closes the flow passage of the pipe 32. When the valve 37 is opened with the pump 33 being operated, the treatment fluid discharged from the outer chamber 12 flows through the pipe 32 to feed the treatment fluid to the nozzle 31. The flow adjustment valve 36 defines the flow rate of the treatment fluid.

The drainage part 40 includes a pipe 41 and a valve 45. A tip of the pipe 41 is connected to a bottom wall of the inner chamber 11 of the treatment chamber 10. The valve is inserted at some midpoint in the pipe 41. The base end of the pipe 41 is connected to drainage equipment of a factory in which the substrate treatment apparatus 100 is installed. When the valve 45 is opened, the treatment fluid stored in the inner chamber 11 is quickly drained from the bottom of the inner chamber 11 to the pipe 41, and treated by the drainage equipment.

The treatment fluid supplying part 30 circulates the treatment fluid in the treatment chamber 10. For example, when the treatment fluid is lacking due to drainage of the drainage part 40, a new fluid supplying mechanism that is not illustrated supplies a new treatment fluid to the treatment chamber 10. Specifically, the new fluid supplying mechanism includes a chemical solution supplying part that supplies a chemical solution to the outer chamber 12 or the inner chamber 11, and a de-ionized water supplying part that supplies de-ionized water to the outer chamber 12 or the inner chamber 11. Thereby, supply of the chemical solution from the chemical solution supplying part to the treatment chamber and supply of the de-ionized water from the de-ionized water supplying part to the treatment chamber 10 dilutes the chemical solution with the de-ionized water.

The bubble supplying part 50 includes a plurality of (six in this embodiment) bubble supply pipes (bubblers) 51, and a pipe line that feeds gas to the bubble supply pipes 51. The six bubble supply pipes 51 are disposed inside the inner chamber 11 of the treatment chamber 10 above the punching plate 17 and below the substrates W held by the lifter 20 at the immersion position.

Each of the six bubble supply pipes 51 is an elongated tubular component with bubble holes aligned in a row on its upper surface that are not illustrated. The bubble supply pipes 51 are made of a material with chemical resistance to a treatment fluid, for example, perfluoroalkoxy alkanes (PFA), Poly Ether Ketone (PEEK), or quartz (PFA is used in the embodiment).

The pipe line that feeds the gas to the six bubble supply pipes 51 includes pipes 52, gas supplying mechanisms 53, and a gas supply source 54. Each of the six bubble supply pipes 51 is connected to a tip of one of the pipes 52. Base ends of the pipes 52 are connected to the gas supply source 54. Furthermore, the pipes 52 are equipped with the respective gas supplying mechanisms 53. In other words, each of the six bubble supply pipes 51 is equipped with one of the gas supplying mechanisms 53. The gas supply source 54 delivers the gas to each of the pipes 52. Each of the gas supplying mechanisms 53 includes a mass flow controller and an open/close valve that are not illustrated, and feeds the gas to the bubble supply pipe 51 through the pipe 52 and adjusts a flow rate of the gas to be fed.

When the gas is fed to each of the six bubble supply pipes 51, the bubble supply pipe 51 ejects the gas into the treatment fluid stored in the treatment chamber 10. When the six bubble supply pipes 51 supply the gas into the treatment fluid stored in the treatment chamber 10, the gas is transformed into bubbles, and the bubbles rise in the treatment fluid. The gas supplied by the bubble supplying part 50 is, for example, an inert gas. The inert gas is, for example, nitrogen or argon (nitrogen is used in the embodiment).

The bubble holes aligned on each of the bubble supply pipes 51 are disposed between the adjacent substrates W held by the lifter 20. Thus, bubbles formed by ejection of the gas from the bubble holes aligned on each of the bubble supply pipes 51 rise between the adjacent substrates W.

The lid 80 opens and closes the upper opening of the treatment chamber 10. The closed lid 80 covers the upper opening of the treatment chamber 10. Furthermore, the opened lid 80 opens the upper opening of the treatment chamber 10, so that the lifter 20 can move the substrates W upward and downward between the immersion position and the lifting position.

Figure 6:
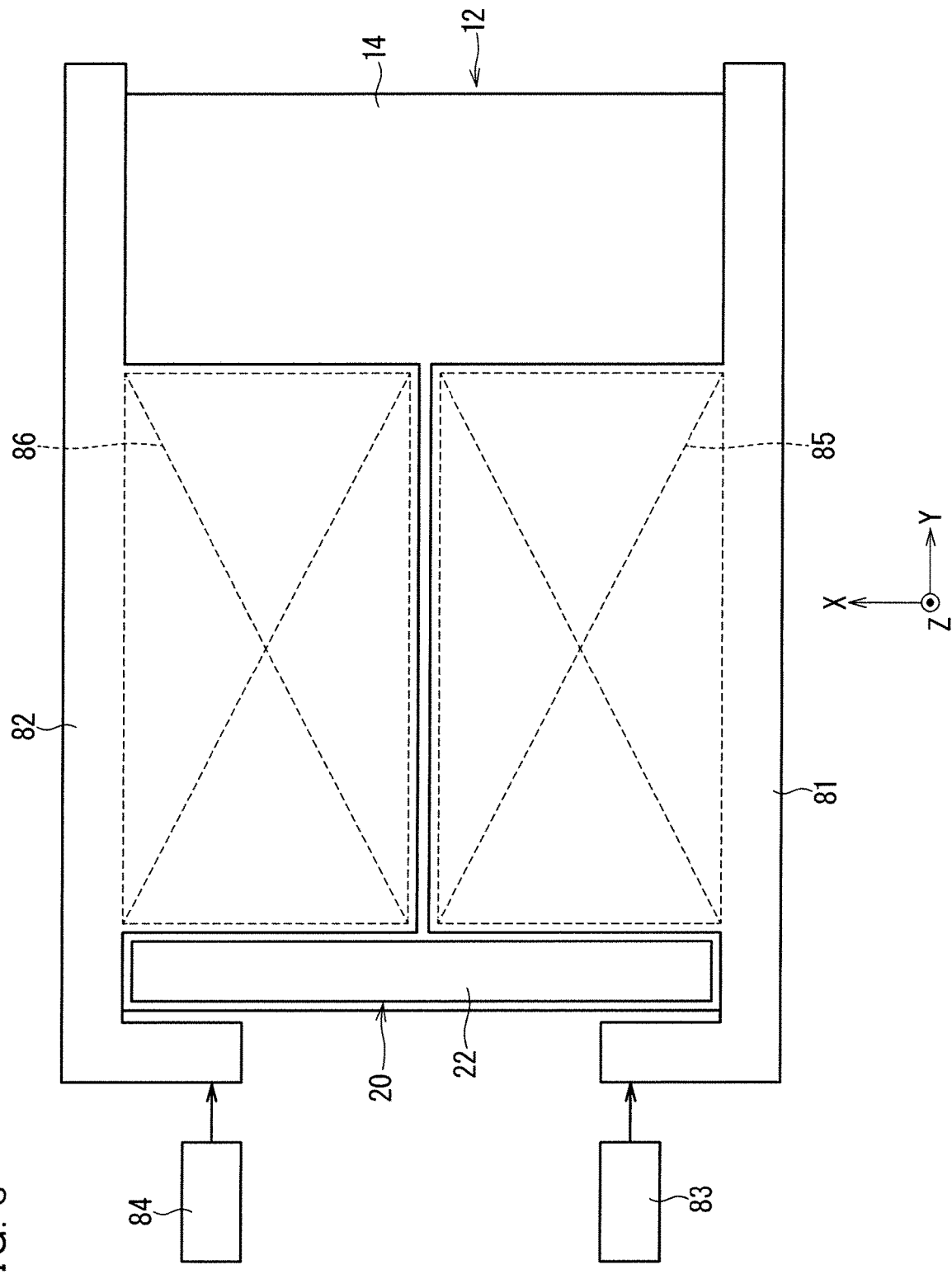
FIG. 6 is a plan view of the treatment part of the substrate treatment apparatus in FIG. 1 when viewed from above.
Figure 7:
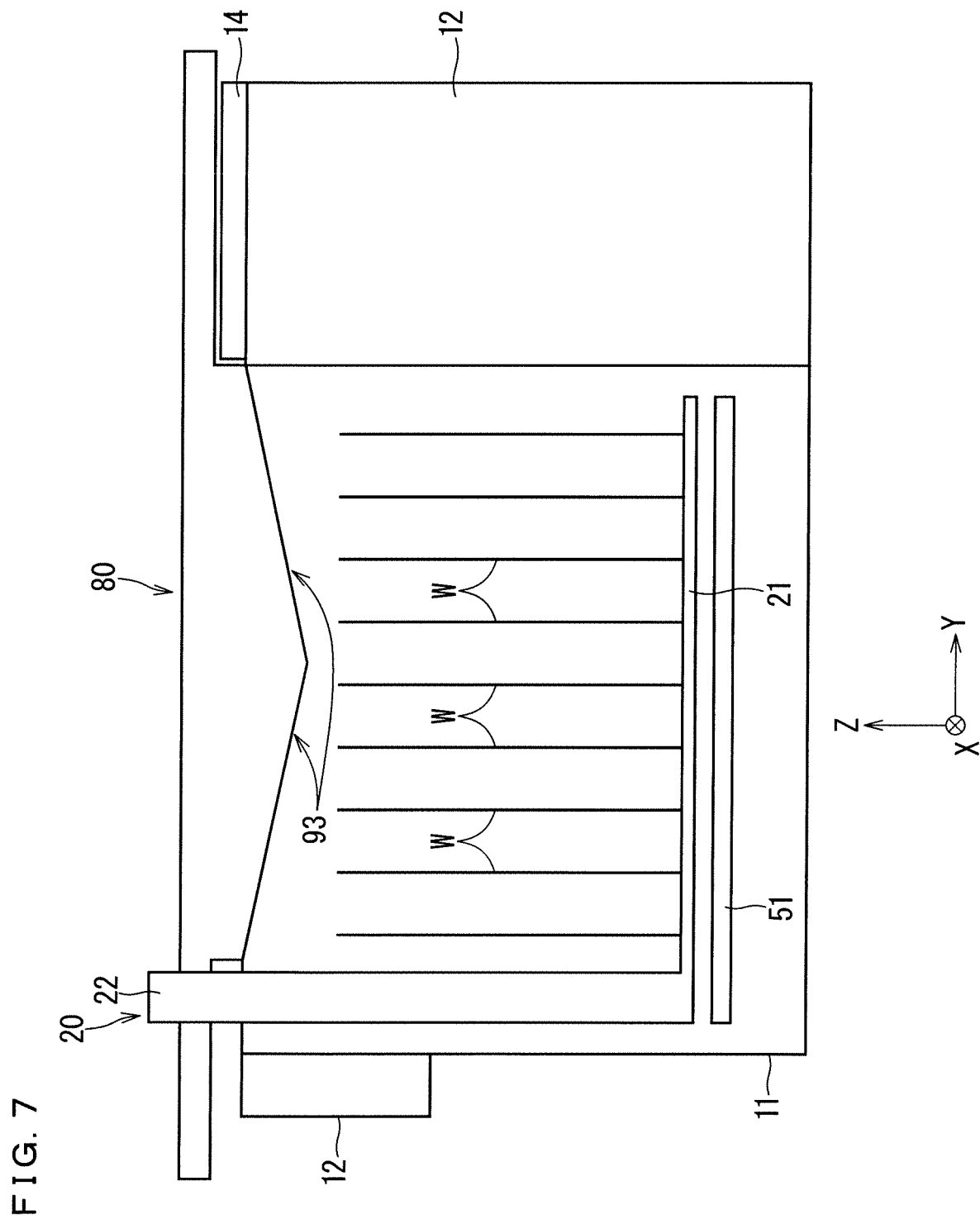
FIG. 7 is a side view of the treatment part of the substrate treatment apparatus in FIG. 1 when viewed from the side surface.

FIG. 6 is a plan view of the treatment part 121 when viewed from above. FIG. 7 is a side view of the treatment part 121 when viewed from the side surface. The lid 80 includes a first lid 81 and a second lid 82. Both of the first lid 81 and the second lid 82 are made of polytetrafluoroethylene (PTFE) which is one of fluorocarbon polymers and has superior chemical resistance. While the lid 80 is closed, the first lid 81 and the second lid 82 cover the entire top of the inner chamber 11. The first lid 81 and the second lid 82 cover a part of the top of the outer chamber 12. An outer chamber cover 14 covers the remainder of the outer chamber 12 (a part on the +Y side).

The first lid 81 is connected to a first opening/closing mechanism 83 conceptually illustrated in FIG. 6. Similarly, the second lid 82 is connected to a second opening/closing mechanism 84. The first opening/closing mechanism 83 and the second opening/closing mechanism 84 are, for example, air cylinders. As indicated by arrows AR22 in FIG. 2, the first opening/closing mechanism 83 and the second opening/closing mechanism 84 cause the first lid 81 and the second lid 82, respectively, to perform open/close operations about a rotation axis in the Y-axis direction.

Figure 8:
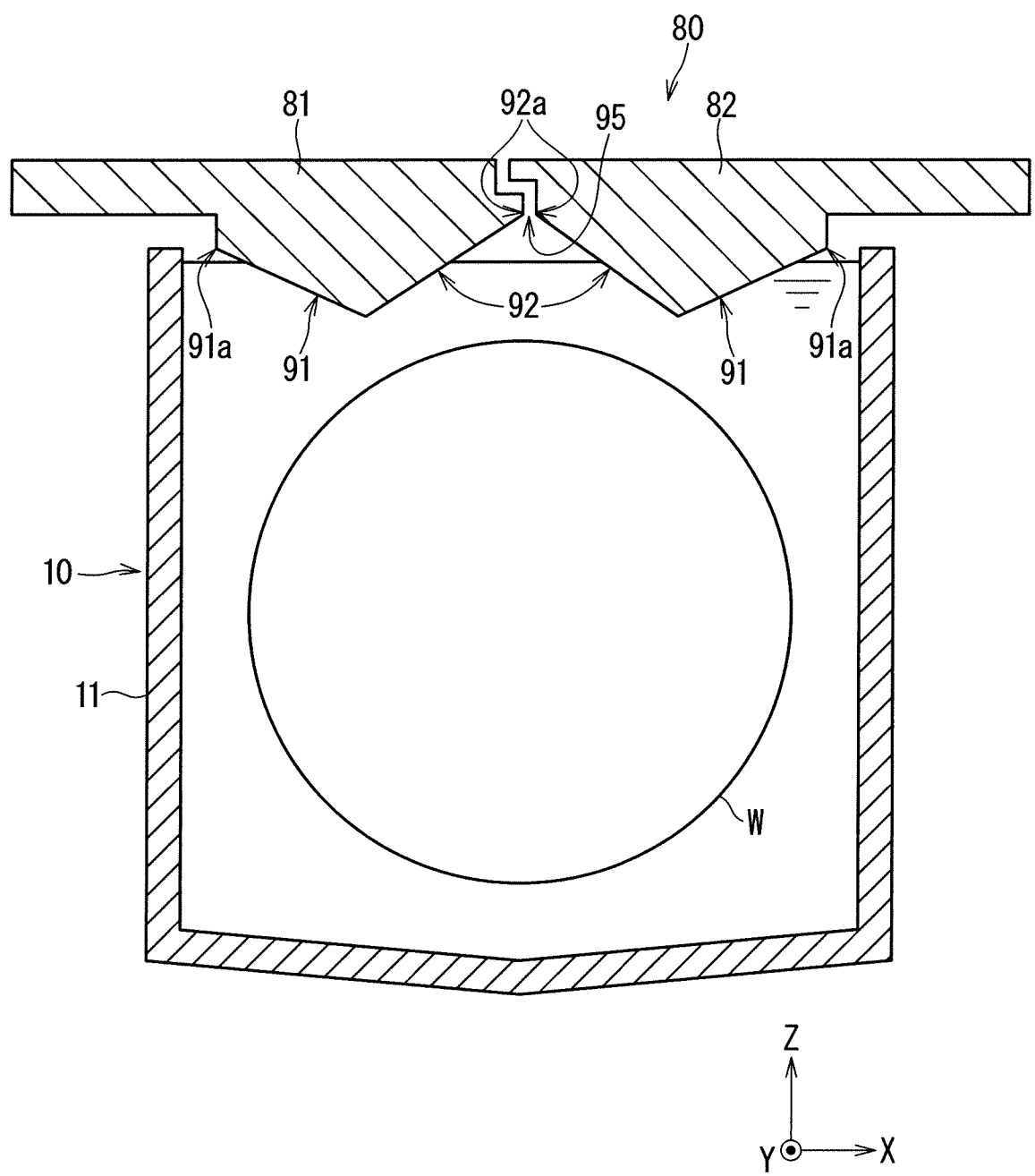
FIG. 8 illustrates closed states of a first lid and a second lid.
Figure 9:
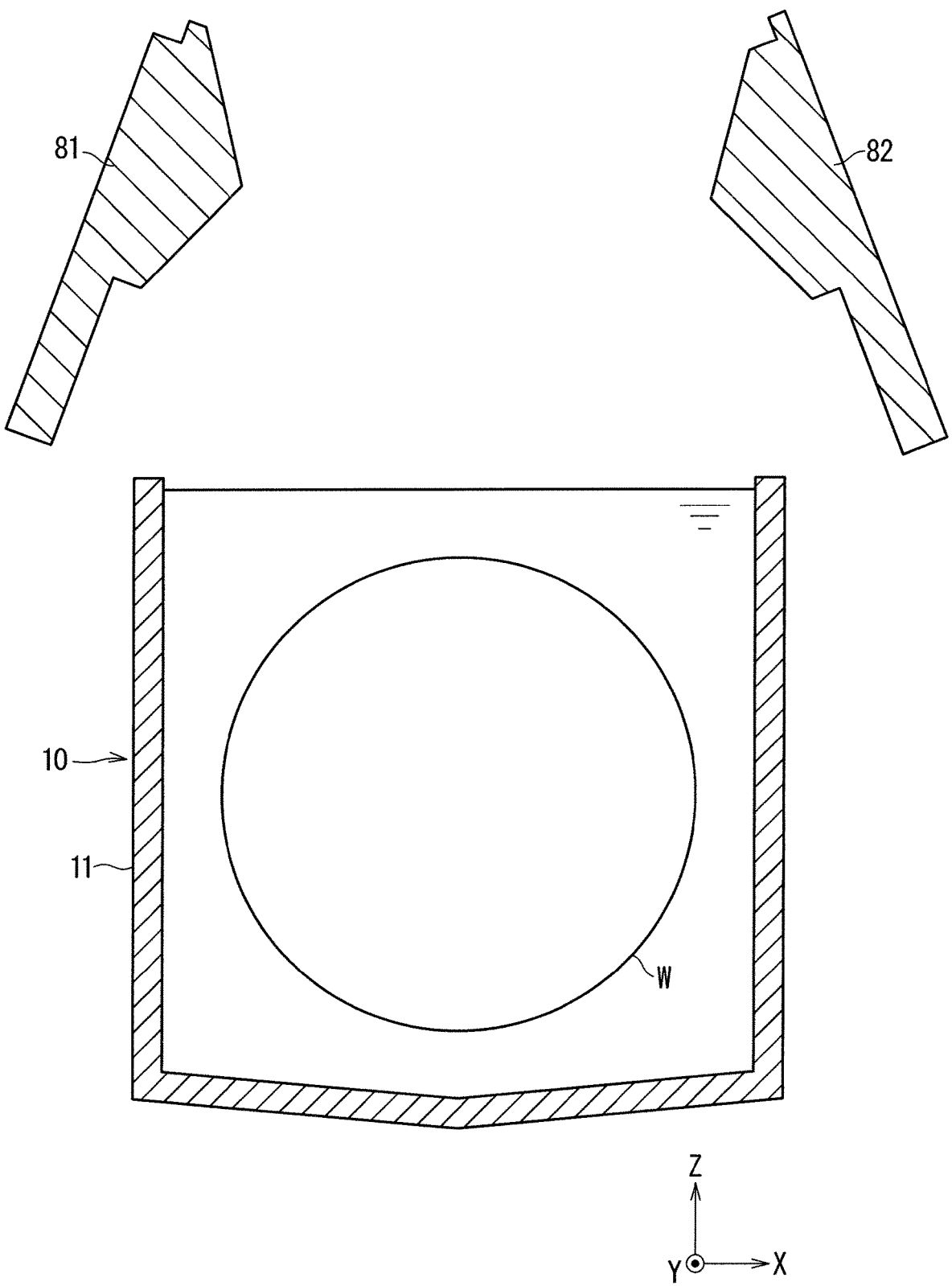
FIG. 9 illustrates opened states of the first lid and the second lid.

FIG. 8 illustrates closed states of the first lid 81 and the second lid 82. FIG. 9 illustrates opened states of the first lid 81 and the second lid 82. The constituent elements such as the bubble supply pipes 51 and the nozzle 31 are omitted in FIGS. 8 and 9. As illustrated in FIG. 8, the first lid 81 and the second lid 82 in the closed states seal the treatment fluid stored in the treatment chamber 10 from an external atmosphere, and suppress dissolving oxygen into the treatment fluid. As illustrated in FIG. 9, when the first lid 81 and the second lid 82 are opened, the treatment fluid stored in the treatment chamber is in contact with an external atmosphere, and the substrates W can be moved upward and downward.

Figure 10:
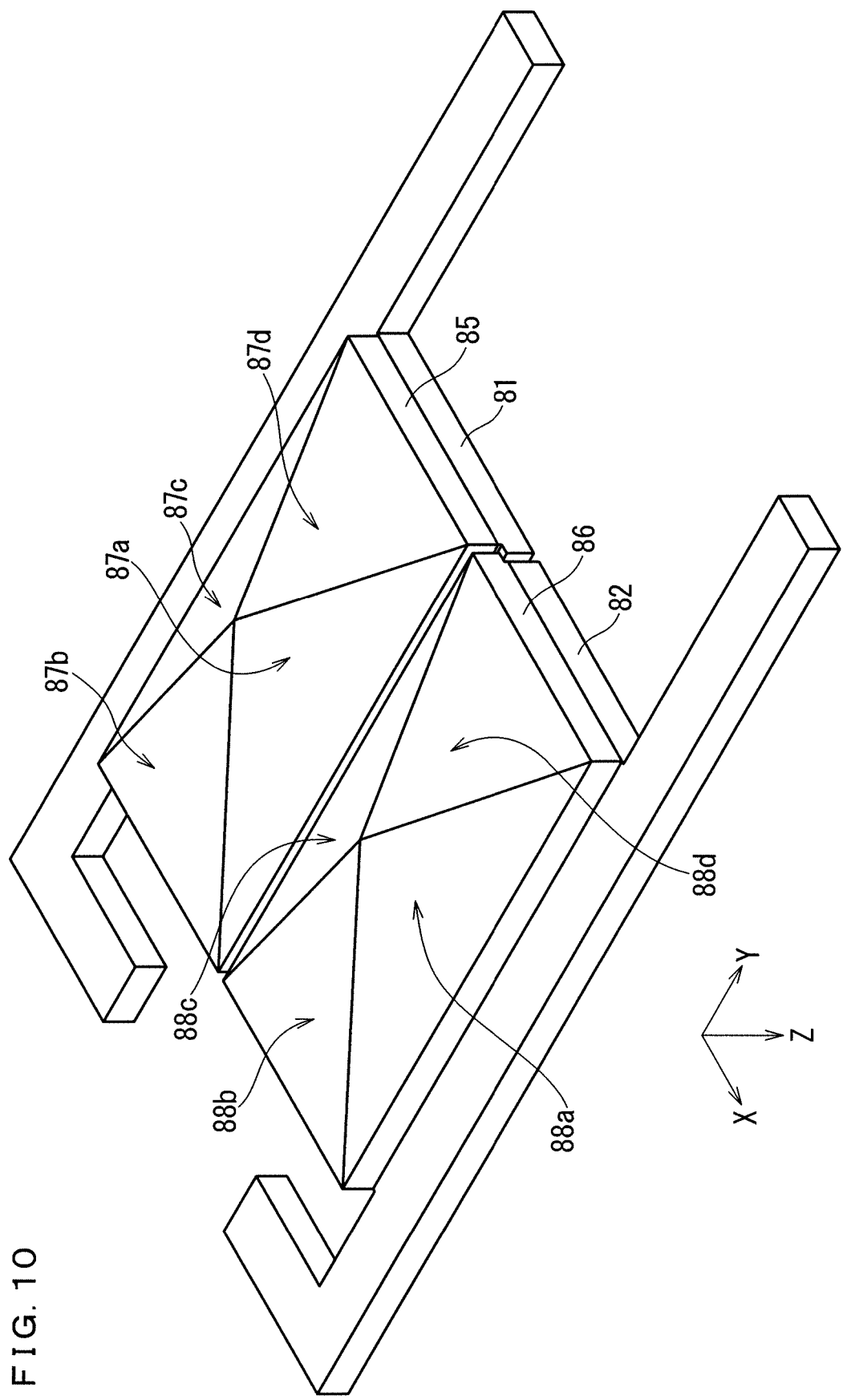
FIG. 10 is a perspective view illustrating a shape of an undersurface of a lid.

FIG. 10 is a perspective view illustrating a shape of an undersurface of the lid 80. A protrusion 85 shaped like a quadrangular pyramid is formed on an undersurface of the first lid 81 that covers the inner chamber 11. Similarly, a protrusion 86 shaped like a quadrangular pyramid is also formed on an undersurface of the second lid 82 that covers the inner chamber 11. Precisely, each of the protrusion 85 and the protrusion 86 has a rectangular undersurface, and is shaped like a rectangular pyramid.

One quadrangular pyramid has four sloped surfaces (tapered surfaces) to surround a rectangular undersurface. As illustrated in FIG. 10, the protrusion 85 of the first lid 81 has four sloped surfaces 87a, 87b, 87c, and 87d. The protrusion 86 of the second lid 82 has four sloped surfaces 88a, 88b, 88c, and 88d. Thus, the protrusion 85 and the protrusion 86 have eight sloped surfaces in total.

The eight sloped surfaces formed on the first lid 81 and the second lid 82 can be categorized into three types based on the properties. First, when the first lid 81 and the second lid 82 in the closed states are viewed in the XZ plane, the sloped surface 87c of the protrusion 85 and the sloped surface 88a of the protrusion 86 are categorized as first sloped surfaces 91 leading more upward as getting closer to edges of the lid 80 (FIG. 8). Next, when the first lid 81 and the second lid 82 are viewed in the XZ plane, the sloped surface 87a of the protrusion 85 and the sloped surface 88c of the protrusion 86 are categorized as second sloped surfaces 92 leading more upward as getting closer to the center of the lid 80. Moreover, when the first lid 81 and the second lid 82 are viewed in the YZ plane, the sloped surfaces 87b and 87d of the protrusion 85 and the sloped surfaces 88b and 88d of the protrusion 86 are categorized as third sloped surfaces 93 leading more upward as getting closer to the edges of the lid 80 (FIG. 7).

As illustrated in FIG. 8, when the first lid 81 and the second lid 82 are closed, upper ends 92a of the second sloped surfaces 92 are higher than upper ends 91a of the first sloped surfaces 91. Specifically, the center above the substrates W at the immersion position has relatively a wider space than the edges in the X direction.

When the first lid 81 and the second lid 82 are closed, a lower end of the first lid 81 (a vertex of the protrusion 85) and a lower end of the second lid 82 (a vertex of the protrusion 86) are higher than upper ends of the substrates W held at the immersion position in this embodiment.

When the first lid 81 and the second lid 82 are closed, crevices are formed between an upper end of the inner chamber 11 and the first lid 81 and between an upper end of the inner chamber 11 and the second lid 82 as illustrated in FIG. 8. Through these crevices, not only the treatment fluid overflows from the inner chamber 11 to the outer chamber 12 but also the gas flows outside.

When the first lid 81 and the second lid 82 are closed, a flow passage 95 is further created between a tip (a +X side end) of the first lid 81 and a tip (a −X side end) of the second lid 82. In other words, the first lid 81 and the second lid 82 in the closed states are not in close contact with each other but have a crevice therebetween. The flow passage 95 is bent.

The controller 70 controls various operating mechanisms provided in the substrate treatment apparatus 100. The controller 70 also controls operations of the treatment part 121. The controller 70 is similar in hardware configuration to typical computers. Specifically, the controller 70 includes a CPU that is a circuit for performing various computation processes, a ROM or read-only memory for storing a basic program, a RAM or readable/writable memory for storing various pieces of information, and a storage (e.g., a magnetic disk or a solid-state drive (SSD)) for storing, for example, control software and data. The controller 70 is electrically connected to, for example, the valve 37 of the treatment fluid supplying part 30 and the gas supplying mechanisms 53, and controls operations of these.

The storage of the controller 70 stores a recipe defining procedures and conditions for treating the substrates W (hereinafter referred to as a "treatment recipe"). The substrate treatment apparatus 100 obtains the treatment recipe, for example, entered and stored in the storage by an operator of this apparatus through a graphical user interface (GUI). Alternatively, the treatment recipe may be stored in the storage after a host computer that manages a plurality of substrate treatment apparatuses 100 passes the treatment recipe to the substrate treatment apparatus 100 through communication. The controller 70 controls the operations of, for example, the gas supplying mechanisms 53 based on the description in the treatment recipe stored in the storage, so that the surface treatment on the substrates W proceeds as described in the treatment recipe.

Next, treatment operations in the treatment part 121 with the aforementioned structures will be described. In the treatment part 121 according to this embodiment, the treatment fluid overflowing from the inner chamber 11 to the outer chamber 12 in the treatment chamber 10 and spilled from the outer chamber 12 returns to the inner chamber 11, so that the treatment fluid is circulating. Specifically, the treatment fluid flowing from the outer chamber 12 to the pipe 32 is sent out to the nozzle 31 by the pump 33. Here, the heater 34 heats the treatment fluid flowing through the pipe 32 as necessary. The flow adjustment valve 36 defines a flow rate of the treatment fluid flowing through the pipe 32. Furthermore, the drainage part 40 drains a spent treatment fluid from the treatment chamber 10 as necessary. A new treatment fluid supplying mechanism supplies a new treatment fluid to the treatment chamber 10. In this embodiment, a mixed solution of strong alkaline TMAH, IPA, and de-ionized water is used as a treatment fluid. Then, polysilicon is etched using TMAH. In etching polysilicon using TMAH, it is known that the higher a concentration of dissolved oxygen is, the lower the etching rate becomes. Thus, reduction of an amount of oxygen dissolved in the treatment fluid is important.

The treatment fluid fed to the nozzle 31 is ejected from the nozzle 31 toward the upper portion of the inner chamber 11. The treatment fluid ejected from the nozzle 31 hits the distribution plate 15 and spreads in the horizontal direction along the plane of the distribution plate 15. The treatment fluid spread by the distribution plate 15 in the horizontal direction reaches the punching plate 17 and passes through the plurality of treatment fluid holes 17a. Then, the treatment fluid rises from the plurality of treatment fluid holes 17a to form a laminar flow of the treatment fluid moving upward in the inner chamber 11. The treatment fluid reaching the upper end of the inner chamber 11 overflows into the outer chamber 12.

The substrates W are immersed in the treatment fluid while the laminar flow of the treatment fluid moving upward is formed in the treatment chamber 10. Specifically, the lifter 20 receives, at the lifting position above the treatment chamber 10, the plurality of substrates W transported by the main transport robot 180. The substrates W are placed on the three retention bars 21 and held by the lifter 20. Subsequently, the controller 70 operates the driving mechanism 24 to lower the lifter 20, lower the substrates W to the immersion position in the treatment chamber 10, and immerse the substrates W in the treatment fluid. Here, the upper opening of the treatment chamber 10 is opened while the first lid 81 and the second lid 82 are opened (see FIG. 9).

After the lifter 20 stops descending and holds the substrates W at the immersion position, the controller 70 operates the first opening/closing mechanism 83 and the second opening/closing mechanism 84 to close the first lid 81 and the second lid 82, respectively (see FIG. 8). Thus, the lid 80 including the first lid 81 and the second lid 82 covers the upper opening of the treatment chamber 10 and seals the treatment fluid stored in the treatment chamber 10 from an external atmosphere to suppress dissolving oxygen into the treatment fluid.

When the first lid 81 and the second lid 82 are closed, at least a part of the protrusion 85 of the first lid 81 and the protrusion 86 of the second lid 82 is immersed in the treatment fluid. Specifically, parts of the sloped surfaces including the vertexes of the protrusions 85 and 86 each shaped like a quadrangular pyramid are located lower than the fluid level of the treatment fluid (see FIG. 8). This can reduce an amount of air retained between the fluid level of the treatment fluid and the lid 80, and effectively suppress dissolving oxygen into the treatment fluid. When the first lid 81 and the second lid 82 are closed, the lower ends of the first lid 81 and the second lid 82 (vertexes of the protrusions 85 and 86) are higher than the upper ends of the substrates W held at the immersion position. The substrates W are held by the lifter 20 at the immersion position while the laminar flow of the treatment fluid is formed in the treatment chamber 10. This enables the laminar flow of the treatment fluid to flow between the substrates W. This exposes the surface of the substrates W to the treatment fluid. Consequently, the surface treatment on the substrates W proceeds (etching in this embodiment).

Furthermore, the gas supplying mechanisms 53 of the bubble supplying part 50 feed the gas (nitrogen) to the respective bubble supply pipes 51. The gas delivered to each of the bubble supply pipes 51 is ejected from the plurality of bubble holes aligned on the bubble supply pipe 51 into the treatment fluid to form bubbles. The plurality of bubble holes are disposed between the adjacent substrates W held by the lifter 20. Thus, bubbles ejected from the bubble supply pipes 51 rise between the adjacent substrates W. In other words, many bubbles rise near the surfaces of the substrates W.

Figure 11:
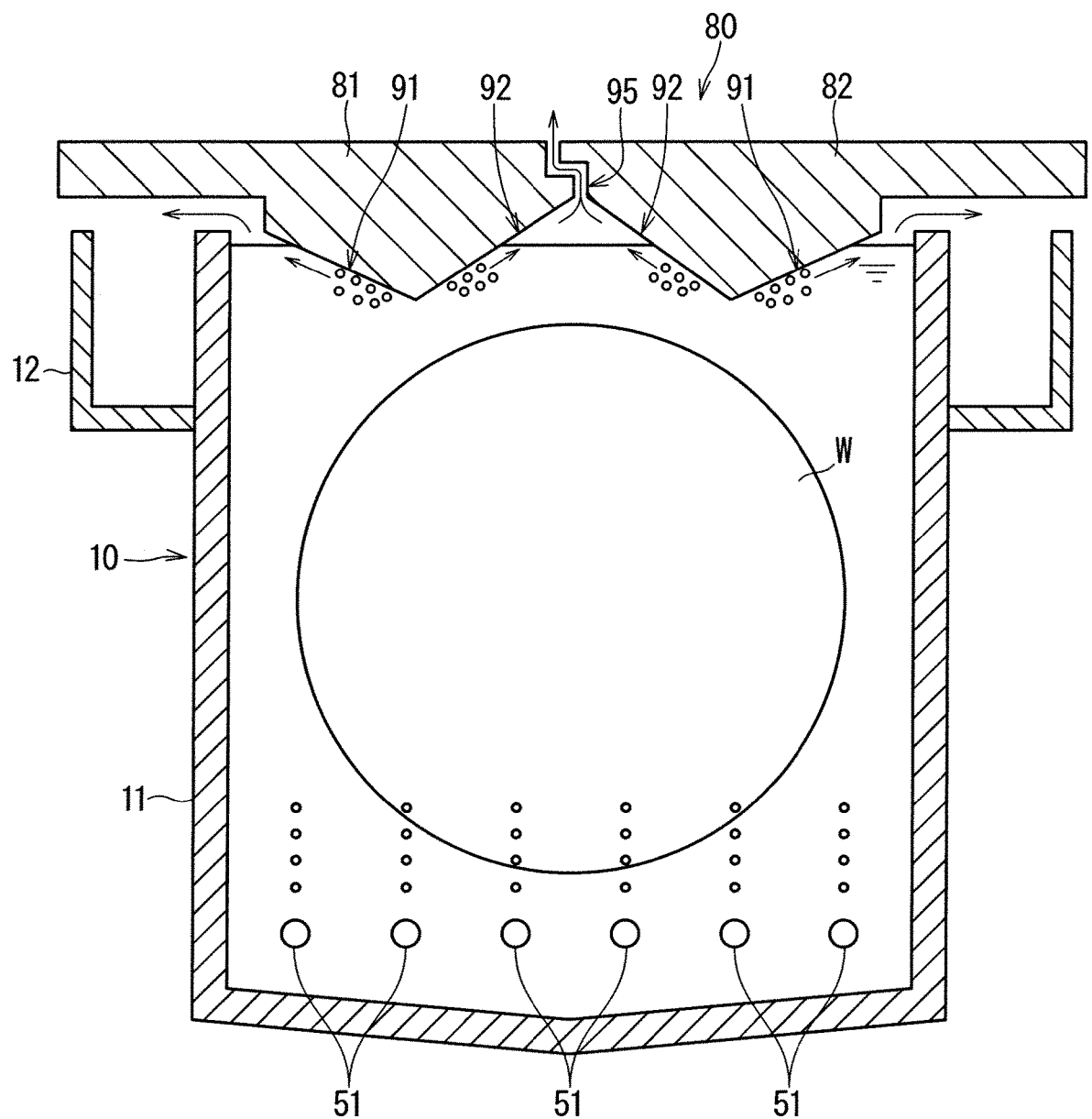
FIG. 11 illustrates treatment on substrates in the treatment part in the substrate treatment apparatus in FIG. 1.

FIG. 11 illustrates treatment of the substrates W in the treatment part 121. When the substrates W are etched using TMAH as in this embodiment, the lower a concentration of dissolved oxygen in the treatment fluid is, the higher an etching rate becomes. When the plurality of bubble supply pipes 51 supply nitrogen bubbles in the treatment fluid, replacement of dissolved oxygen in the treatment fluid with nitrogen reduces the concentration of dissolved oxygen. This can consequently increase the etching rate of the substrates W.

The nitrogen bubbles ejected from the six bubble supply pipes 51 rise in the treatment fluid, and reach the fluid level. Since the parts of the first lid 81 and the second lid 82 are immersed in the treatment fluid in this embodiment, the bubbles reach an interface between the treatment fluid, the first lid 81, and the second lid 82. When much bubbles adhere to the lid 80 and are retained at the interface between the treatment fluid, the first lid 81, and the second lid 82, the proximity of the upper ends of the substrates W is in contact with the bubbles. Since the treatment fluid is not in contact with the proximity of the upper ends of the substrates Win this state, the proximity of the upper ends is not etched. This consequently impairs the in-plane uniformity in etching the substrates W. Since the treatment fluid contains particularly IPA in this embodiment, bubbles hardly disappear and are easily retained at the interface.

Here, the first lid 81 and the second lid 82 have the protrusion 85 and the protrusion 86 shaped like quadrangular pyramids, respectively, to form a plurality of sloped surfaces in this embodiment. As illustrated in FIG. 11, a part of the bubbles reaching the interface between the treatment fluid, the first lid 81, and the second lid 82 is guided diagonally upward to the peripheral ends of the inner chamber 11 along the first sloped surfaces 91, and released outside the treatment chamber 10 through the crevices formed between the upper end of the inner chamber 11 and the first lid 81 and between the upper end of the inner chamber 11 and the second lid 82. Another part of the bubbles reaching the interface is guided diagonally upward to the center of the inner chamber 11 along the second sloped surfaces 92, and released outside the treatment chamber 10 through the flow passage 95 between the first lid 81 and the second lid 82. Furthermore, a part of the remaining bubbles reaching the interface is guided diagonally upward to the peripheral ends of the inner chamber 11 along the third sloped surfaces 93, and released outside the treatment chamber 10 through the crevices formed between the upper end of the inner chamber 11 and the first lid 81 and between the upper end of the inner chamber 11 and the second lid 82.

In this manner, the bubbles reaching the interface between the treatment fluid, the first lid 81, and the second lid 82 are smoothly released outside the treatment chamber 10. This can prevent interruption of etching a part of the substrates W due to a contact of the bubbles with the part. Furthermore, outflows of nitrogen gas from the crevices formed between the upper end of the inner chamber 11 and the first lid 81 and between the upper end of the inner chamber 11 and the second lid 82 and through the flow passage 95 can suppress inflows of oxygen in an external atmosphere through the crevices and the flow passage 95. This can consequently suppress reduction in the in-plane uniformity in etching the substrates W by smoothly releasing the bubbles as well as reducing the inflows of oxygen from an atmosphere.

After the end of etching for a predetermined time period, the controller 70 operates the first opening/closing mechanism 83 and the second opening/closing mechanism 84 to open the first lid 81 and the second lid 82, respectively. Next, the controller 70 operates the driving mechanism 24 to raise the lifter 20 and lift the substrates W from the treatment chamber 10. Then, the main transport robot 180 receives the treated substrates W from the lifter 20. As described above, a series of processes in the treatment part 121 is completed.

In this embodiment, the protrusion 85 and the protrusion 86 shaped like quadrangular pyramids are formed on the undersurfaces of the first lid 81 and the second lid 82, respectively, to form the first sloped surfaces 91, the second sloped surfaces 92, and the third sloped surfaces 93. In the surface treatment on the substrates W, the first lid 81 and the second lid 82 in the closed states cover the fluid level of the treatment fluid to suppress dissolving oxygen from an external atmosphere into the treatment fluid. Furthermore, immersing at least a part of the protrusion 85 of the first lid 81 and the protrusion 86 of the second lid 82 in the treatment fluid reduces an amount of air retained between the fluid level of the treatment fluid, the first lid 81, and the second lid 82 as much as possible, and further suppresses dissolving oxygen into the treatment fluid. This can suppress a decrease in an etching rate, particularly, on the top of the substrates W.

Furthermore, nitrogen bubbles ejected from the plurality of bubble supply pipes 51 rise in the treatment fluid, and reach the interface between the treatment fluid, the first lid 81, and the second lid 82. The first sloped surfaces 91, the second sloped surfaces 92, and the third sloped surfaces 93 guide the nitrogen bubbles reaching the interface, diagonally upward. Thus, the nitrogen bubbles are smoothly released outside the treatment chamber 10 through the crevices formed between the upper end of the inner chamber 11 and the first lid 81 and between the upper end of the inner chamber 11 and the second lid 82 and through the flow passage 95. This can eliminate retention of the bubbles at the interface, and prevent the bubbles from contacting a part of the substrates W. Consequently, the entire surfaces of the substrates W are uniformly in contact with the treatment fluid. Thus, the in-plane uniformity in etching the substrates W can be maintained. Specifically, even when nitrogen bubbles are supplied with the lid 80 being immersed in the treatment fluid, a decrease in the treatment uniformity can be suppressed.

Furthermore, outflows of nitrogen gas from the crevices formed between the upper end of the inner chamber 11 and the first lid 81 and between the upper end of the inner chamber 11 and the second lid 82 and through the flow passage 95 can suppress inflows of oxygen in an external atmosphere through the crevices and the flow passage 95. This can further suppress dissolving oxygen into the treatment fluid, reduce the concentration of dissolved oxygen in the treatment fluid as much as possible, and increase the etching rate of the substrates W.

The upper ends 92a of the second sloped surfaces 92 are higher than the upper ends 91a of the first sloped surfaces 91 (FIG. 8). Relatively a wider space is provided above the proximity of the upper ends of the circular substrates W. Thus, bubbles are hardly retained above the upper ends of the substrates W at the shortest distance from the fluid level. Consequently, contacts between the substrates W and the bubbles can be more reliably prevented.

While the embodiment according to the present disclosure is described above, various modifications in addition to those described above can be made without departing from the scope and spirit of the disclosure. For example, although the lower ends of the first lid 81 and the second lid 82 are higher than the upper ends of the substrates W in this embodiment, the heights are not limited to this relationship. As illustrated in FIG. 12, when the first lid 81 and the second lid 82 are closed, the lower ends of the first lid 81 and the second lid 82 may be lower than the upper ends of the substrates W held at the immersion position.

Figure 13:
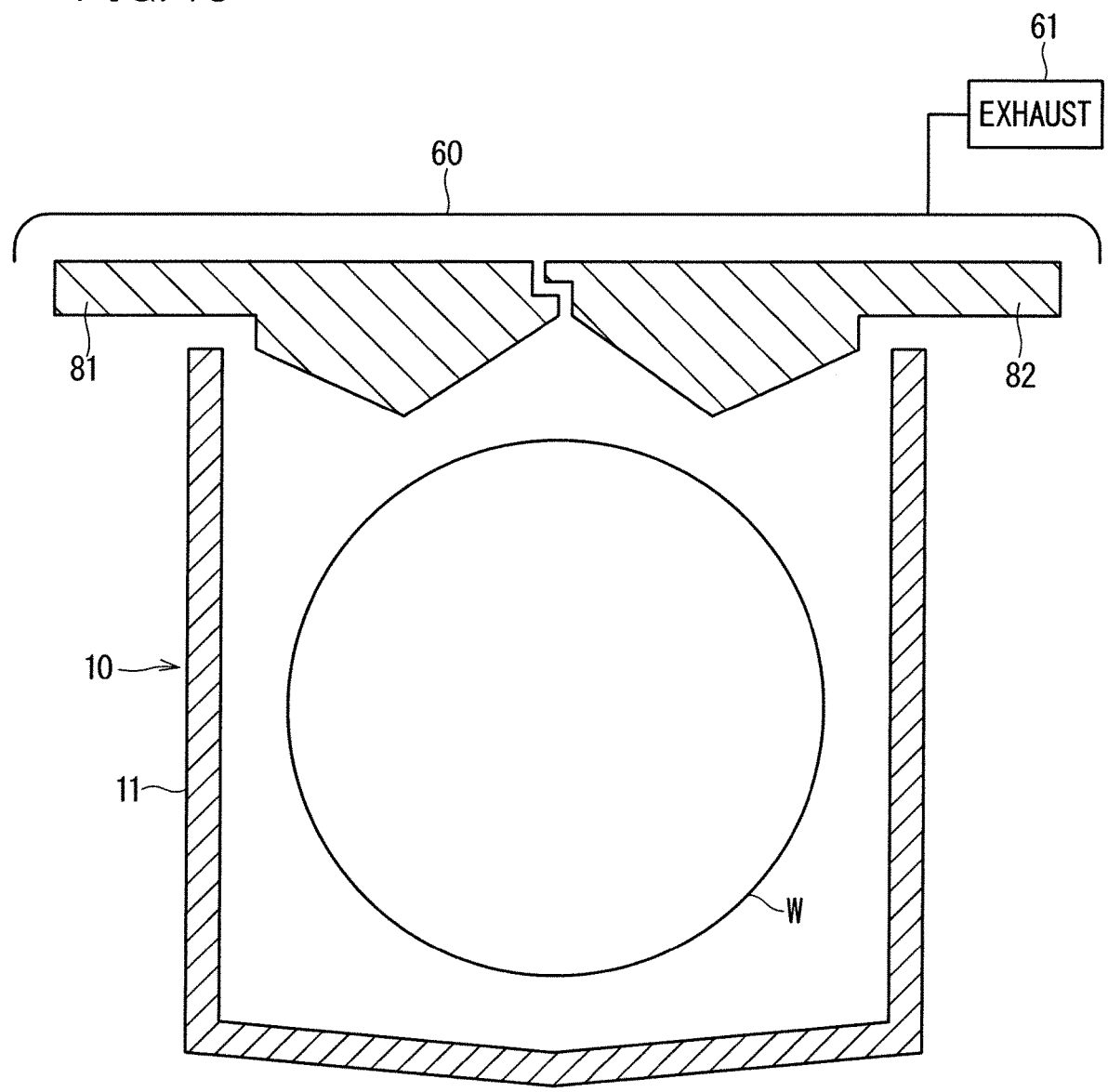
FIG. 13 illustrates another example treatment part.

As illustrated in FIG. 13, a cover 60 covering the top of the first lid 81 and the second lid 82 may be provided. The cover 60 is connected to an exhaust part 61. The exhaust part 61 exhausts an atmosphere in the inner space covered by the cover 60. In etching the substrates W, the cover 60 covers the top of the first lid 81 and the second lid 82 in the closed states. The exhaust part 61 evacuates the inner space under the cover 60. This can accelerate ejection of the bubbles reaching the interface between the treatment fluid, the first lid 81, and the second lid 82.

While the invention has been shown and described in detail, the foregoing description is in all aspects illustrative and not restrictive. It is therefore understood that numerous modifications and variations can be devised without departing from the scope of the invention.

What is claimed is:

1. A substrate treatment apparatus that subjects a substrate to a surface treatment using a treatment fluid, the apparatus comprising:
 a treatment chamber storing the treatment fluid;
 a treatment fluid supplying part supplying the treatment fluid into the treatment chamber;
 a substrate holder holding the substrate and immersing the substrate in the treatment fluid stored in the treatment chamber;
 a tubular bubble supply pipe disposed inside the treatment chamber and supplying, from below the substrate held by the substrate holder, bubbles in the treatment fluid stored in the treatment chamber; and
 a lid covering an upper opening of the treatment chamber, wherein the lid includes:
  a first sloped surface leading more upward as getting closer to an edge of the lid;
  a second sloped surface leading more upward as getting closer to a center of the lid,
 the lid includes a first lid and a second lid that are openable and closable, and
 each of the first lid and the second lid includes a protrusion shaped like a quadrangular pyramid.

2. The substrate treatment apparatus according to claim 1, wherein an upper end of the second sloped surface is higher than an upper end of the first sloped surface.

\* \* \* \* \*